United States Patent
Maeda et al.

(10) Patent No.: US 8,083,121 B2
(45) Date of Patent: Dec. 27, 2011

(54) PASTE FOR SOLDERING AND SOLDERING METHOD USING THE SAME

(75) Inventors: Tadashi Maeda, Fukuoka (JP); Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 367 days.

(21) Appl. No.: 10/585,729

(22) PCT Filed: Oct. 27, 2005

(86) PCT No.: PCT/JP2005/019749
§ 371 (c)(1),
(2), (4) Date: Jul. 12, 2006

(87) PCT Pub. No.: WO2006/049069
PCT Pub. Date: May 11, 2006

(65) Prior Publication Data
US 2008/0048009 A1  Feb. 28, 2008

(30) Foreign Application Priority Data
Nov. 4, 2004 (JP) .................................. 2004-320232

(51) Int. Cl.
*B23K 31/00* (2006.01)
(52) U.S. Cl. ................ 228/111.5; 228/208; 228/262.45; 228/214; 228/256; 228/215; 228/207; 438/612
(58) Field of Classification Search ............... 228/111.5, 228/208, 262.45, 248, 214, 215, 256; 438/612
See application file for complete search history.

(56) References Cited

U.S. PATENT DOCUMENTS

| | | | | |
|---|---|---|---|---|
| 5,837,119 | A | * | 11/1998 | Kang et al. ..................... 205/74 |
| 6,189,771 | B1 | * | 2/2001 | Maeda et al. ............... 228/248.1 |
| 6,680,128 | B2 | * | 1/2004 | Mei .............................. 428/570 |
| 6,951,666 | B2 | * | 10/2005 | Kodas et al. ................ 427/376.6 |
| 2002/0185309 | A1 | | 12/2002 | Imamura et al. |
| 2003/0121564 | A1 | * | 7/2003 | Taguchi et al. .................. 148/25 |
| 2004/0026484 | A1 | | 2/2004 | Yamashita et al. |
| 2004/0177997 | A1 | | 9/2004 | Hata et al. |

FOREIGN PATENT DOCUMENTS

| | | |
|---|---|---|
| JP | 2000-031210 | 1/2000 |
| JP | 2002-314241 | 10/2002 |
| JP | 2003264259 A * | 9/2003 |
| JP | 2004-274000 | 9/2004 |
| WO | WO 2005/072906 A1 | 8/2005 |

OTHER PUBLICATIONS

JP 2003264259 A english computer translation.*
European Search Report issued in European Patent Application No. EP 05805313.13-1215/1808265 PCT/JP2005019749, dated Sep. 18, 2009.

* cited by examiner

*Primary Examiner* — Jessica L Ward
*Assistant Examiner* — Erin Saad
(74) *Attorney, Agent, or Firm* — McDermott Will & Emery LLP

(57) ABSTRACT

In the soldering method, metal-powder-contained flux is disposed between bumps and circuit electrodes when electronic parts are mounted by soldering, the metal powder comprising a core metal formed of metal such as tin and zinc and a surface metal covering surfaces of the core metal formed of noble metal such as gold and silver. Accordingly, metal powder will not remain as residue that is liable to cause migration after the reflow process, and it is possible to assure both soldering effect and insulation effect.

4 Claims, 5 Drawing Sheets

PASTE FOR SOLDERING AND SOLDERING METHOD USING THE SAME

RELATED APPLICATION

This application is a U.S. National Phase application of PCT International application PCT/JP2005/019749, which claims priority to JP 2004-320232 filed on Nov. 4, 2004, which is hereby incorporated by reference.

TECHNICAL FIELD

The present invention relates to a soldering paste used for soldering and a soldering method using the same.

BACKGROUND ART

Conventionally, a soldering method is widely employed for mounting electronic parts on a substrate. As methods for the embodiment of soldering, various methods are employed such as a method of forming metallic bumps by soldering as bonding electrodes disposed on electronic parts and a method of solder pre-coating for forming solder layers on the electrode surface of a substrate. Recently, from the viewpoint of environmental protection, solder containing almost no harmful lead, so-called lead-free solder, is generally employed in the above soldering.

Lead-free solder is greatly different in component and composition from conventional lead-type solder, and therefore, with respect to flux used in a soldering process, the one so far used in general cannot be used as it is. That is, conventional flux is insufficient in activation, resulting in inadequate removal of oxide film on the solder surface, and it is difficult to assure excellent solder wettability. To make up for the deficiency of such solder being poor in solder wettability, flux having such a composition that metal powder formed of metal having excellent solder wettability such as silver is mixed in the solder component is disclosed in Japanese Laid-Open Patent 2000-31210. By using such flux, it is possible in the reflow process to wet and spread molten solder along the surface of metal powder in the flux and to guide the molten solder to electrodes to be soldered. However, in the case of such flux, the following problem may arise depending upon the rate of metal powder contained.

Recently, since a non-washing process that omits washing for removing flux component after soldering (hereinafter called non-washing process) is mainly employed, flux component as residue remains sticking around soldered portions after the reflow process, and metal powder contained in the flux also remains around soldered portions.

Then, in case the amount of residual metal powder is considerable, there is a possibility of defective insulation caused due to migration. And if the amount of metal powder is reduced in order to prevent such defective insulation, it will result in lowering of the effect of guiding molten solder by metal powder in the reflow process and invite lowering of the soldering effect. Thus, a conventional soldering paste such as flux containing metal powder involves a problem such that it is difficult to satisfy requirements for obtaining both soldering effect and insulation effect.

DISCLOSURE OF THE INVENTION

The soldering paste of the present invention is a soldering paste to be disposed between solder portion and second electrode when a first electrode formed with the solder portion is soldered to the second electrode, which comprises liquid basis formed of resin component, an activator removing oxide film on surfaces of the solder portion, metal powder including a core metal and a surface metal to cover surfaces of the core metal, wherein the surface metal is formed of metal having excellent solder wettability of the solder portion, and the core metal is formed of metal capable of taking in the surface metal under solution heat in the reflow process.

Further, the soldering method of the present invention is a soldering method for soldering a first electrode formed with solder portion to a second electrode, which comprises the steps of coating a soldering paste, comprising liquid basis formed of resin component, an activator removing oxide film on surfaces of the solder portion, and a metal powder including a core metal and a surface metal to cover surfaces of the core metal, on at least one of the solder portion and the second electrode, disposing the soldering paste between the solder portion and the second electrode by positioning the first electrode and the second electrode, letting molten solder come in contact with the first electrode and the second electrode by melting the solder under heat and wetting and spreading it along surfaces of the metal powder, and also dissolving the surface metal into the core metal to take it in, and solidifying the molten solder after letting molten solder come in contact with the first electrode and the second electrode.

In the present invention, metal powder mixed in for the purpose of obtaining the effect of guiding molten solder in the reflow process includes a core metal and a surface metal to cover surfaces of the core metal, and the surface metal has excellent solder wettability, while the core metal is capable of taking in the surface metal under heat in the reflow process. Thus, metal powder will not remain as residue in a state of being liable to cause migration after the reflow process, and it is possible to satisfy the requirements for obtaining both soldering effect and insulation effect.

REFERENCE NUMERALS IN THE DRAWINGS

1 Substrate
2 Circuit electrode
3 Flux
4 Electronic part
4B External connection electrode
6, 6Z Bump
8 Metal powder
8A Core metal
8B Surface metal

DETAILED DESCRIPTION OF THE PREFERRED EMBODIMENTS

The preferred embodiments of the present invention will be described in the following with reference to the drawings. The drawings are schematic drawings, and individual positions are not correctly shown with respect to dimensions.

Figure 1A:
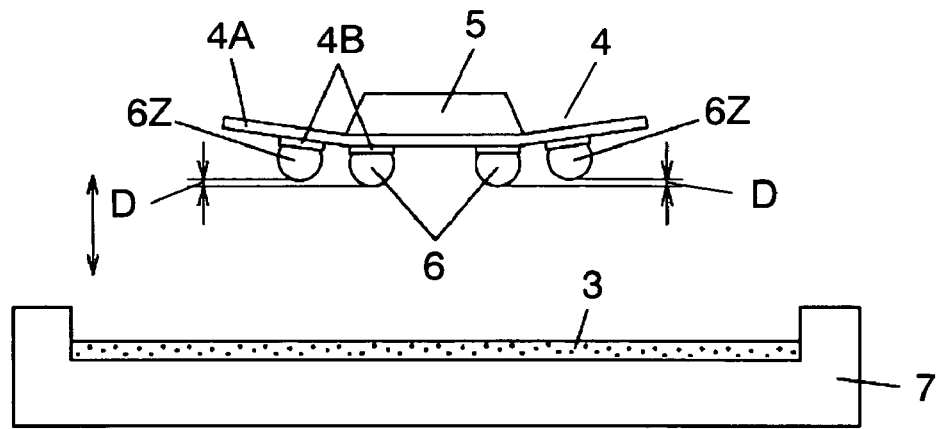
FIG. 1A-1C are illustrations for describing an electronic part mounting process in one preferred embodiment of the present invention.

Firstly, electronic parts mounting method by soldering with use of the soldering paste of the present invention is described with reference to FIG. 1-2. In this preferred embodiment, electronic part 4 is mounted by soldering on substrate 1 with circuit electrode 2 (the second electrode) formed on the upper surface thereof. As shown in FIG. 1A, electronic part 4 is configured in that external connection electrode 4B (the first electrode) is disposed on the lower surface of resin substrate 4A with part mounting portion 5 provided on the upper surface thereof, and further, bump 6 is formed as a solder portion on external connection electrode 4B. Bump 6 is formed by soldering fine particle solder balls to external connection electrode 4B. Incidentally, solder is a metal of low melting point (such as tin) or an alloy of multiple kinds of metals (such as silver-tin alloy). In this preferred embodiment, lead-free solder containing almost no lead out of these metals and alloys is used as a soldering material.

Part mounting portion 5 is formed by resin-sealing a semiconductor element (not shown) mounted on the upper surface of resin substrate 4A. In the resin sealing process, molten resin at high temperatures is poured into mold cavity and thermosetting the resin to form a resin mold. After that, the resin mold is taken out from the resin cavity and cooled in the atmosphere. In the cooling process, due to the difference in thermal expansion coefficient between substrate 2 and the resin mold, part mounting portion 5 at the upper surface side of resin substrate 4A is more contracted as compared with resin substrate 4A. Consequently, the whole of electronic part 4 deforms in such a manner that the end portion of resin substrate 4A bends in the direction of part mounting portion 5.

Figure 1B:
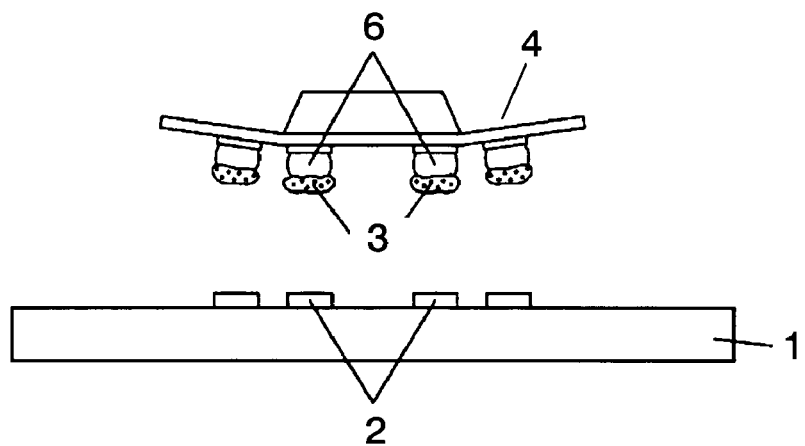

Accordingly, as to the plurality of bumps 6 formed on the lower surface of electronic part 4, the lower end of bump 6Z positioned at the outer periphery is higher by displacement D caused due to bending and deforming than the lower end of bump 6 positioned inside. As a result, the lower end of each bump 6 is not at the same plane in height, and a gap is liable to be created between bump 6Z and circuit electrode with electronic part 4 placed on the substrate as described in the following. Flux 3, soldering paste described in the following, is coated by transferring on bump 6. That is, electronic part 4 is moved up and down against transfer table 7 with paint film of flux 3 formed thereon, thereby transferring and applying flux 3 to the lo lower end of bump 6 as shown in FIG. 1B. Flux 3 used is disposed between bump 6 and circuit electrode 2 in order to improve the soldering effect in soldering for mounting electronic part 4 onto substrate 1 described in the following.

The composition of flux 3 will be described in the following. Flux 3 is a mixture of a highly viscous liquid basis prepared by dissolving resin component such as rosin in solvent and an activator and metal powder 8 as additive components. The activator is added for the purpose of removing oxide film of solder generated on the surface of bump 6, and for example, organic acid having such oxide film removing ability is used. Also, used as activators are those of low activation [N (2-hydroxyethyl) iminodiacetic acid, m-hydroxybenzoic acid, L-phenylalanine, mesaconic acid, etc.] that require no washing after soldering.

Figure 4A:
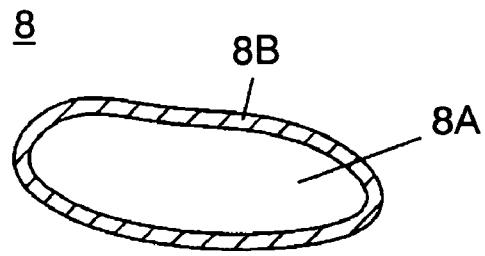
FIG. 4A-4C are sectional views of metal powder mixed into a soldering paste in one preferred embodiment of the present invention.

As metal powder 8, as shown in FIG. 4A, those including core metal 8A as a core and surface metal 8B which covers the surfaces of core metal 8A are used. In this configuration, metal used as core metal 8A is selected from the group of tin (Sn), zinc (Zn), lead (Pb), and indium (In), and thin metallic foil is formed by using this kind of metal. And a coat of surface metal 8B is formed by electroplating or the like on the surface of this metallic foil.

Here selected as the material for surface metal 8B is a material having a melting point higher than that of the solder used for bump 6, which produces no oxide film on the surfaces of metal powder 8 in the atmosphere and is also excellent in wettability for solder that forms bump 6, having such characteristics that fluidized solder that is molten bump 6 is easy to wet and spread along the surfaces. For example, it is preferable to use noble metal such as gold (Au) and silver (Ag) of over 90% in purity. And it is added to flux 3 by mixing metal powder 8 into the basis by ratio ranging from 1 to 20 vol %.

Here, the combination of metals used for core metal 8A and surface metal 8B is preferable to be such that dissolving from surface metal 8B into internal core metal 8A (see FIG. 4B) is easily generated due to heat in the reflow process, realizing such a dissolution characteristic that most is taken into core metal 8A with the dissolving of surface metal 8B into core metal 8A completed at the end of reflow. That is, in this configuration, surface metal 8B has excellent wettability for the solder, and core metal 8A is capable of taking the surface metal 8B into itself by dissolving under heat in the reflow process. Employing such a configuration of metal powder mixed into solder paste 3, it is possible to obtain excellent effects as described later in soldering by using a non-washing system. As the metal powder, it is most preferable to employ such combinations that core metal 8A includes tin or tin-based alloy (Sn—Ag, Sn—Ag—Cu, Sn—Pb, Sn—Pb—Ag, Sn—Cu, Sn—Bi, Sn—Ag—Bi, Sn—Ag—Bi—In, Sn—Sb, Sn—In, Sn—Zn, Sn—Zn—Bi, Sn—Zn—Al, etc.) and surface metal 8B includes silver.

Figure 1C:
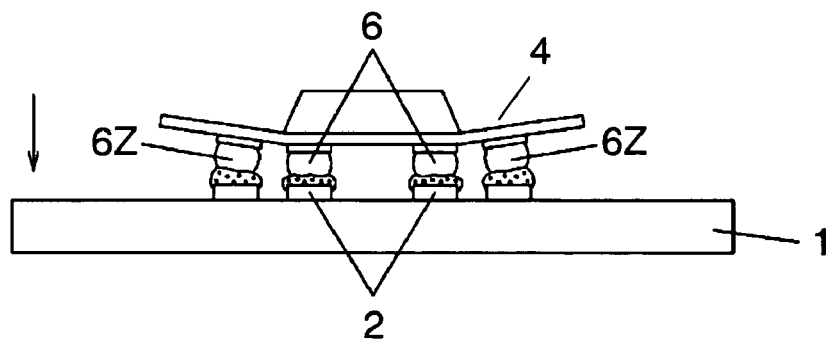

Subsequently, as shown in FIG. 1C, electronic part 4 with flux transferred and applied thereto is mounted on substrate 1. Electronic part 4 is mounted on substrate 1 by melting bump 6 under heat and soldering it on the upper surface of circuit electrode 2. In this way, each external connection electrode 4B is electrically connected to corresponding circuit electrode 2, and electronic part 4 is fixed on substrate 1 by means of solder portions formed with molten solder solidified.

In this mounting process, electronic part 4 is placed on substrate 1, and bump 6 is positioned to circuit substrate 2, then it is lowered to substrate 1. And, bump 6 with flux 3 coated thereon is landed onto circuit electrode 2 and pressed with a predetermined pressure. Thus, the lower ends of bumps 6 whose lower ends are at the average height out of bumps 6 come in contact with the upper surface of circuit electrode 2 as bumps 6 being a little higher are slightly deformed in the direction of height by the pressure even in case the bumps are somewhat variant in height. On the other hand, the lower end of bump 6Z located at the outer periphery does not come in contact with the surface of circuit electrode 2 even when other bumps 6 are slightly deformed, causing the whole of electronic part 4 to be lowered for that amount, and then a gap is created between the bump bottom surface and circuit electrode 2.

Figure 2A:
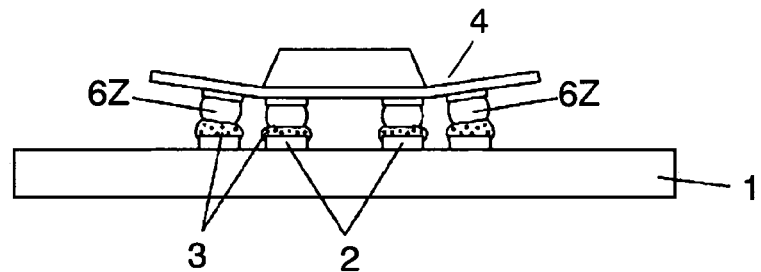
FIG. 2A-2C are illustrations for describing an electronic part mounting process in one preferred embodiment of the present invention.

The soldering process for melting and soldering bump 6 onto circuit electrode 2 will be described in the following. Substrate 1 with parts shown in FIG. 1C mounted thereon is delivered to a reflow furnace and heated. In this case, as shown in FIG. 2A, bump 6 near the central portion where its lower end is at the average height is heated in a state that the lower end is in contact with circuit electrode 2, while bump 6Z located at the outer periphery is heated in a state that flux 3 is disposed between the lower end and circuit electrode 2.

Figure 2B:
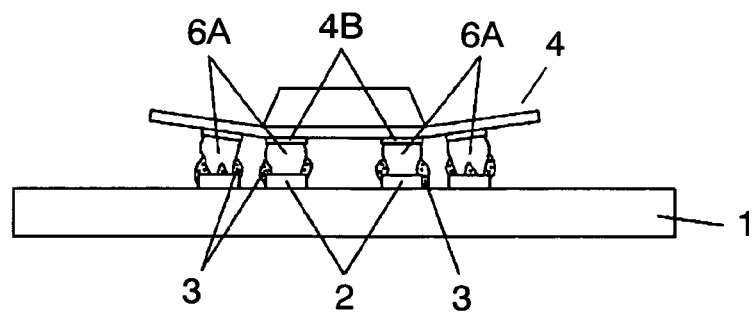

And as a result of the heating, both bumps 6 and 6Z are soldered to circuit electrode 2, but the behavior of the solder varies depending upon whether or not the lower end of the bump is in contact with circuit electrode 2. That is, as shown in FIG. 2B, in the case of bump 6 whose lower end is in contact with circuit electrode 2, when bump 6 is melted under heat, solder 6A in the molten state immediately wets and spreads along the surface of circuit electrode 2 having excellent solder wettability, and thereby, external connection electrode 4B is connected by solder 6A to circuit electrode 2. In this case, oxide film on the surface of bump 6 is removed by the activator contained in flux 3.

Figure 3A:
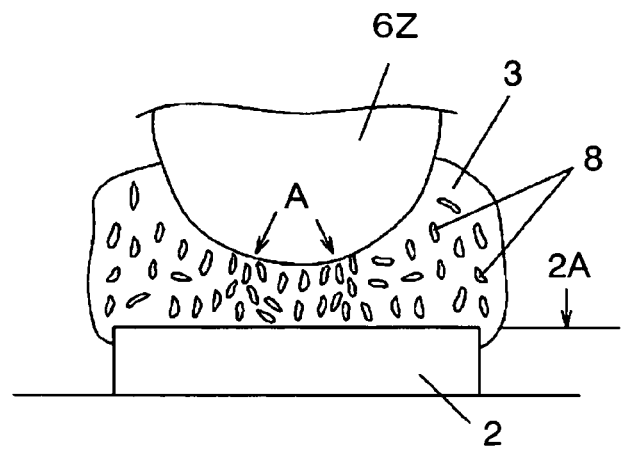
FIG. 3A-3C are illustrations for describing a soldering process using a soldering paste in one preferred embodiment of the present invention.
Figure 3B:
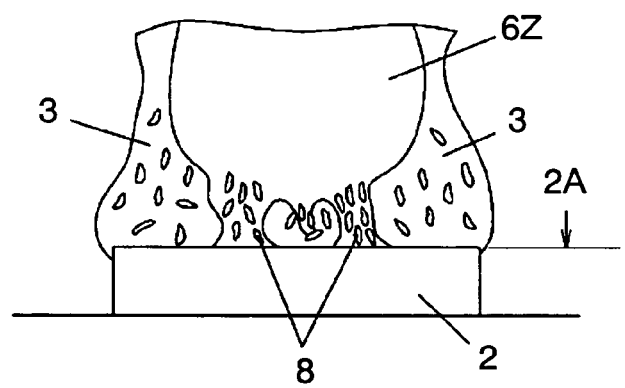
Figure 3C:
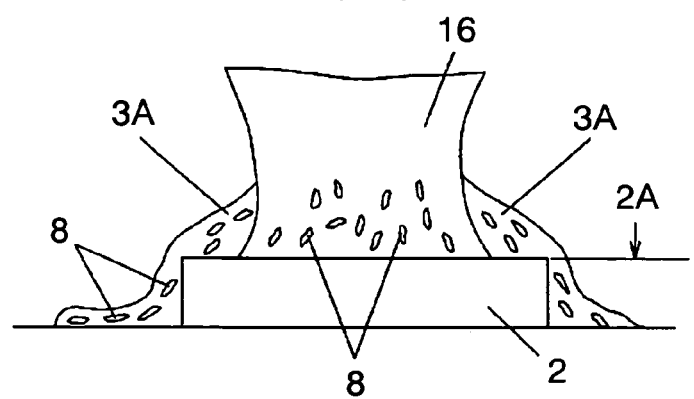

On the other hand, in the case of bump 6Z, since there is a gap between it and circuit electrode 2, external connection electrode 4B is connected to circuit electrode 2 by means of solder 6A through processes as shown in FIG. 3A to FIG. 3C.

FIG. 3A shows a state at start of heating in the reflow process. In the figure, metal powder 8 in flux 3 existing between the lower end of bump 6Z and surface 2A of circuit electrode 2 contains metallic flakes. Consequently, a bridge of metal powder 8 connecting the lower end of bump 6Z to surface 2A of circuit electrode 2 is formed at a high probability by metal powder 8 much existing at random (see the portion shown by arrow A in FIG. 3A).

The bridge is a state of metal powders 8 being close to each other and existing in the form of a continuous chain. And the state of being close to each other is such that as fluidized solder wetting and covering the surface of one metal powder 8 comes to have a certain thickness due to surface tension, a plurality of metal powders 8 exist at such intervals that the surface of solder having the thickness comes in contact with other adjacent metal powders 8.

That is, multiple metal powders 8 continuously exist in a state of being close to each other, and the solder touching to metal powder 8 at one side of the chain wets and spreads while wrapping the surface of metal powder 8 that contains metal having excellent wettability for solder, thereby sequentially coming in contact with adjacent metal powders 8. Thus, the flow of solder as a result of its wetting and spreading is continuously generated up to the other side of the chain, and then, the chain of metal powders 8 functions as a bridge that connects the lower end of bump 6Z to surface 2A of circuit electrode 2, enabling the flow of the solder, as shown in FIG. 3B.

In this case, as the material for surface metal 8B of metal powder 8, noble metals such as gold and silver whose melting point is higher than the melting point of solder generally used are employed, and therefore, even when heated at temperatures higher than the melting point of solder, surface metal 8B precisely exists in a solid state. That is, in a soldering method using cream solder containing solder particles in flux 3, the solder particles in the cream solder are also melted due to heat during the reflow process, and it is unable to obtain a bridge that functions as go-between for molten solder in gaps. On the other hand, in the case of flux 3 used in this preferred embodiment, it is possible to obtain such a bridge function mentioned above.

And, metal powder 8 used for flux 3 is configured in that expensive noble metals such as gold and silver are used as surface metal 8B that covers the surface of inexpensive core metal 8A. Accordingly, it is possible to greatly reduce the cost as compared with a method using noble metal as it is in the form of powder in conventional flux containing metal powder. Incidentally, there already exists solder formed of alloy of metal that can be selected as core metal 8A and silver (e.g. Sn—Ag solder), but such solder and metal powder 8 in this preferred embodiment can be clearly discriminated from each other in terms of action effects obtained by metal powder 8.

Here, as the shape of metal powder 8, by using flakes of metal as described above, it is easier to form a bridge due to metal powder 8 existing with the lengthwise side of the flake-like shape faced in the direction of bridging the gap, making it possible to efficiently form a bridge at a relatively low content. And once solder 6A reaches electrode surface 2A via such a bridge, solder 6A in a state of fluid wets and spreads along electrode surface 2A having excellent solder wettability. As a result of wetting and spreading of solder 6A, flux 3 in the vicinity of electrode surface 2A is forced outside, and also in bump 6Z with a gap initially created between it and circuit electrode 2, external connection electrode 4B is entirely connected by solder 6A to circuit electrode 2.

Also in this case, the soldering effect is improved by the activator contained in flux 3, and even in case the oxide film on the bump surface is only partially removed due to the above-mentioned bridge forming effect, it is possible to assure excellent soldering effect. Consequently, the activator contained in flux 3 is not required to have a strong activating effect. In other words, the addition of metal powder 8 enables the use of low-active flux having a low activating effect, and even when there remains flux 3 after soldering, circuit electrode 2 is hard to be corroded by the active component. Accordingly, because of the combined effects with the insulation improving effect obtained due to the characteristics of metal powder 8 described later, it is possible to assure excellent reliability even in the case of a non-washing process.

FIG. 3C shows the cooled state after completion of the predetermined heating cycle in the reflow process. That is, bump 6 is solidified as molten solder 6A becomes cooled down, thereby forming soldered portion 16 which connects external connection electrode 4B to circuit electrode 2 by means of soldering. In the vicinity of electrode surface 2A of soldered portion 16, metal powder 8 taken into the solder in the soldering process exists in a state of alloy or solid solution. At the peripheries of electrode surface 2A and circuit electrode 2, there remains residue 3A (resin component or activator), after evaporation of solvent component from flux 3, together with metal powder 8 not taken into soldered portion 16.

Figure 2C:
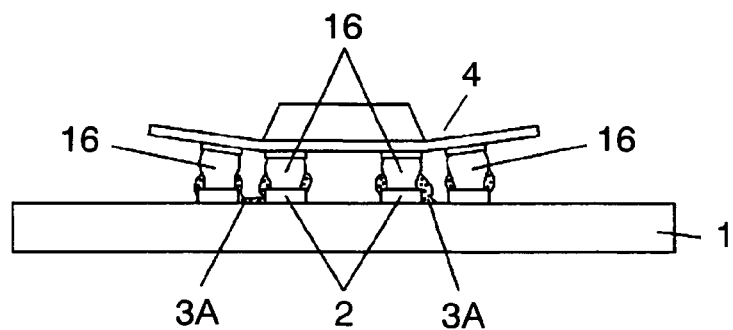

FIG. 2C shows a state such that soldered portion 16 connecting external connection electrode 4B to circuit electrode 2 is formed with respect to every external connection electrode 4B and circuit electrode 2, and the residue 3A including the metal powder 8 remains sticking around circuit electrode 2. Thus, in the combination of external connection electrode 4B and circuit electrode 2 to be subjected to soldering, even in case a gap is created between the lower end and circuit electrode 2 with respect to bump 6Z positioned at the outer periphery, it is possible to assure excellent soldering effect by using flux 3 as soldering paste and the soldering method shown in the present preferred embodiment.

Figure 4B:
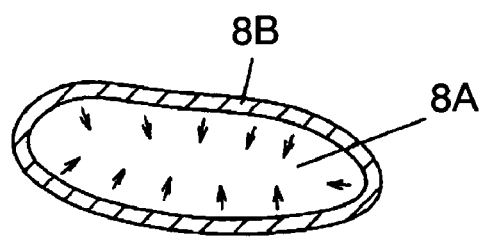
Figure 4C:
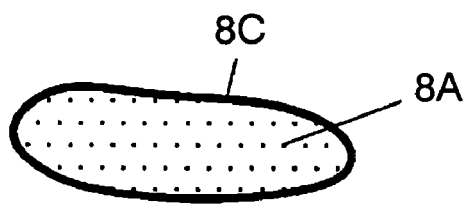

The alteration of metal powder 8 in the reflow process will be described in the following. In each metal powder 8, as the heating is continued, surface metal 8B dissolved is gradually taken into core metal 8A, as shown in FIG. 4B. Here, depending upon the kind of metal of core metal 8A and the heating temperature, the dissolution of surface metal 8B takes place sometimes in liquid-phase core metal 8A and sometimes in solid-phase core metal 8A. In any of the cases, surface metal 8B is gradually taken into core metal 8A. And, the surface of core metal 8A with surface metal 8B completely taken therein is exposed, and as shown in FIG. 4C, oxide film 8C produced due to heating of core metal 8A is formed on the surface of metal powder 8. And oxide film 8C has an effect of improving the insulation after soldering as described in the following.

In the non-washing process, residue 3A and metal powder 8 shown in FIG. 2C remain intact around circuit electrode 2. When metal such as gold and silver is used as it is as metal powder to be mixed into soldering paste, there may arise a problem of migration that will cause electrical corrosion between circuit electrodes and lowering of the insulation depending upon the amount of residue. Accordingly, it is conventionally needed to reduce the mixing rate of metal powder for the purpose of assuring the insulation, and as a result, it is unable to obtain a sufficient effect of improving solder wettability for guiding molten solder in the reflow process.

On the other hand, by using metal powder 8 of the present invention, even in case metal powder 8 much remains around circuit electrode 2 after the soldering process, there occurs no migration and it is possible to obtain excellent insulation effect because the surface of metal powder 8 is covered with electrically stable oxide film 8C. Accordingly, using metal powder 8 of the present invention, it is possible to improve the soldering effect by mixing a sufficient amount of metal powder into the soldering paste and to enhance the mounting reliability by assuring the insulation effect after soldering.

In other words, using metal powder 8 of the present invention, it is possible to realize flux 3 of excellent non-washing type with respect to both soldering effect and insulation effect. That is, in the case of electronic parts with bumps formed by lead-free solder whose hardness is very high so that the bump is hardly deformed, even when a gap is created between the bump and the circuit electrode of the substrate due to deformation of electronic parts or variant sizes of bumps, it is possible to obtain the following effects. That is, the occurrence of defective mounting such that bumps are not reliably soldered to circuit electrodes can be effectively prevented, and also it is possible to obtain excellent insulation effect even in case of employing the non-washing process.

The soldering method in electronic part mounting described above is a soldering method for soldering external connection electrode 4B with bumps 6 formed as solder portions to circuit electrode 2, comprising the steps of applying flux 3 having the above configuration to at least one of bump 6 and circuit electrode 2, disposing flux 3 between bump 6 and circuit electrode 2 by positioning bump 6 and circuit electrode 2, letting molten solder come in contact with circuit electrode 2 by melting bump 6 under heat and wetting and spreading it along the surface of metal powder 8, and also dissolving surface metal 8B of metal powder 8 into core metal 8A to take it in, and solidifying the molten solder after letting molten solder come in contact with circuit electrode 2.

Figure 5A:
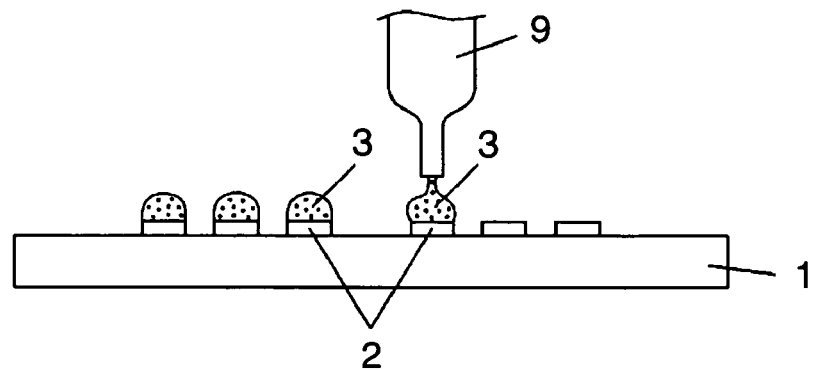
FIG. 5A-5C are illustrations for describing a method of feeding a soldering paste in mounting electronic parts in one preferred embodiment of the present invention.
Figure 5B:
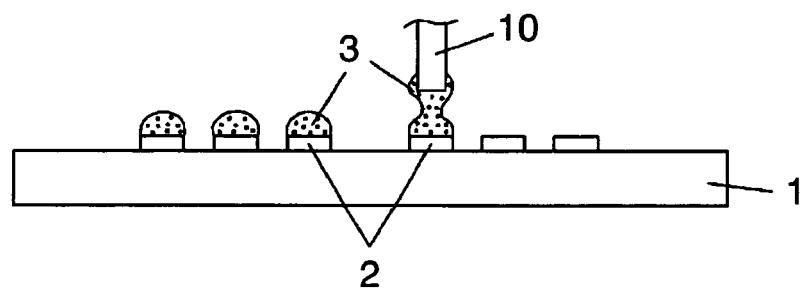

In the example described above, in the step of applying flux 3, an example of transferring flux 3 onto bump 6 to apply it thereon is mentioned, but it is also preferable to employ other various methods. For example, as shown in FIG. 5A, it is also preferable to feed the flux to circuit electrode 2 by discharging flux 3 with use of dispenser 9. Also, as shown in FIG. 5B, it is preferable to transfer and feed flux 3 onto circuit electrode 2 by means of transfer pin 10.

Figure 5C:
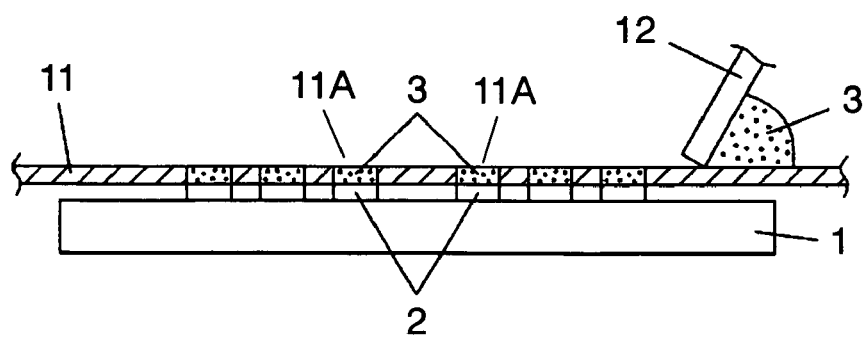

Further, as shown in FIG. 5C, it is preferable to print flux 3 on circuit electrode 2 by using a screen printing method. That is, mask plate 11 provided with pattern hole 11A corresponding to circuit electrode 2 is mounted on substrate 1, and flux 3 is filled into pattern hole 11A by means of squeegee 12 to print the flux on the surface of circuit electrode 2.

In the above preferred embodiment, the first electrode is external connection electrode 4B formed on electronic part 4, and solder portion is bump 6 formed on external connection electrode 4B, and bump 6 is soldered to circuit electrode 2 that is the second electrode as described in the example. However, the present invention is not limited to the above preferred embodiment.

For example, the present invention is also applicable in such case that the first electrode is a circuit electrode formed on a substrate, and the solder portion is a soldering pre-coat formed on a circuit electrode.

Further, even when solder particles are mixed in flux 3 shown in the present preferred embodiment and used as soldering paste, similar effects can be obtained by mixing metal powder 8 having the above configuration into flux 3. In this case, metal powder 8 in the reflow process functions as a core for coagulating molten solder when solder particles existing in a state of being diffused in soldering paste are melted.

That is, since the surface of metal powder 8 is excellent in wettability for solder, molten solder coming in contact with metal powder 8 moves along the surface of metal powder due to surface tension while wetting the surface of metal powder 8, and the molten solder will soon gather to cover metal powder 8. Due to the molten metal coagulating effect, it is possible to obtain excellent soldering effect even in case of using solder poor in wettability as in lead-free solder. Besides the effect of improving solder wettability, electrically stable oxide film that is oxidized core metal is produced on the surface of metal powder 8 after soldering the same as in the above example, and thereby, it is possible to prevent generation of migration after soldering and to obtain excellent insulation effect.

INDUSTRIAL APPLICABILITY

The present invention provides a soldering paste capable of obtaining high-quality solder portions without generation of defective bonding and lowering of insulation effects. And, the paste can be widely used in the soldering method for soldering electronic parts to a substrate by using lead-free solder.

The invention claimed is:

1. A soldering method for soldering a first electrode having a solder portion to a second electrode by melting under heat the solder portion of the first electrode, the method comprising steps of:
  (a) coating a soldering paste on at least one of the solder portion of the first electrode and the second electrode, the soldering paste comprising liquid basis formed of resin component, an activator for removing oxide film produced on surfaces of the solder portion, and a flake-like shaped metal powder including a core metal and a surface metal covering a surface of the core metal, wherein the solder portion wets and spreads along the surface metal when the solder portion is fluidized, and the core metal includes tin or tin-based alloy, and the surface metal includes silver;
  (b) positioning the first electrode and the second electrode so that the soldering paste coated in the step (a) is disposed between the solder portion of the first electrode and the second electrode;
  (c) letting molten solder come in contact with the second electrode by melting the solder portion under heat and wetting and spreading the molten solder along surfaces of the metal powder included in the soldering paste by guiding the molten solder; and
  (d) solidifying the molten solder after the step (c), thereby forming a soldered portion which connects the first electrode to the second electrode, wherein:
  in the step (a), an amount of the flake-like shaped metal powder in the soldering paste is 1-20 vol %, in the step (c), the surface of the core metal is exposed at a portion of the metal powder which is not in contact with the molten solder, while the surface metal is taken into the core metal by dissolution, and in the step (d), the soldered portion is formed by the solder portion and most of the metal powder included in the soldering paste for coating in the step (a).

2. The soldering method of claim 1, wherein the activator includes one of N (2-hydroxyethyl) iminodiacetic acid, m-hydroxybenzoic acid, L-phenylalanine and mesaconic acid.

3. The soldering method of claim 1, wherein:

the solder portion of the first electrode includes a plurality of solder portions and the second electrode includes a plurality of protruding portions corresponding to the plurality of solder portions, the method further includes, before the step (c), a step of contacting the first electrode and the second electrode, in the step of contacting, at least one of the solder portions of the first electrode and at least one of the protruding portions of the second electrode are contacted, while at least one of the solder portions is not in contact with a corresponding one of the protruding portions.

4. The soldering method of claim 1, wherein, in the step (a), and the first electrode and the second electrode protrude from respective substrates.

* * * * *